United States Patent
Yang et al.

(10) Patent No.: US 7,514,339 B2
(45) Date of Patent: Apr. 7, 2009

(54) METHOD FOR FABRICATING SHALLOW TRENCH ISOLATION STRUCTURES USING DIBLOCK COPOLYMER PATTERNING

(75) Inventors: Haining Yang, Wappingers Falls, NY (US); Wai-Kin Li, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 46 days.

(21) Appl. No.: 11/621,124

(22) Filed: Jan. 9, 2007

(65) Prior Publication Data
US 2008/0164558 A1    Jul. 10, 2008

(51) Int. Cl.
*H01L 21/30* (2006.01)
(52) U.S. Cl. .................. 438/424; 438/221; 438/780; 257/E21.54; 257/E21.628; 257/E21.642
(58) Field of Classification Search .................. 438/424, 438/218, 221, 219, 404, 778, 779, 780, 781; 257/E21.54, E21.628, E21.642, E21.546
See application file for complete search history.

(56) References Cited

U.S. PATENT DOCUMENTS

| | | | |
|---|---|---|---|
| 6,555,442 B1 | 4/2003 | Pai et al. | |
| 6,565,763 B1* | 5/2003 | Asakawa et al. | 216/56 |
| 7,071,047 B1* | 7/2006 | Furukawa et al. | 438/197 |
| 7,078,774 B2 | 7/2006 | Kondo et al. | |
| 2002/0123227 A1 | 9/2002 | Winningham et al. | |
| 2005/0079282 A1 | 4/2005 | Jin | |
| 2005/0106837 A1* | 5/2005 | Nakai et al. | 438/427 |
| 2005/0250053 A1 | 11/2005 | Marsh et al. | |
| 2006/0128155 A1 | 6/2006 | Miyata et al. | |

* cited by examiner

*Primary Examiner*—W. David Coleman
*Assistant Examiner*—Shaka Scarlett
(74) *Attorney, Agent, or Firm*—Rosa S. Yaghmour

(57) ABSTRACT

A method of isolating semiconductor devices formed on a semiconductor substrate having a silicon on insulator (SOI) layer is provided. The method includes forming at least one shallow trench area on a pad nitride layer deposited on a surface of the SOI layer, wherein the at least one shallow trench area includes an opening for exposing a portion of the SOI layer; applying diblock copolymer material over the pad nitride layer and the at least one shallow trench area; annealing the applied copolymer material to form self-organized patterns; and partially etching the shallow trench area using the diblock copolymer material as an etch mask. A semiconductor structures is also described having an isolation structure formed on a SOI layer of a semiconductor substrate the isolation structure having an oxidized substrate region; and a void region formed on the oxidized substrate region.

20 Claims, 6 Drawing Sheets

METHOD FOR FABRICATING SHALLOW TRENCH ISOLATION STRUCTURES USING DIBLOCK COPOLYMER PATTERNING

BACKGROUND OF THE INVENTION

1. Technical Field

The present disclosure relates generally to shallow trench isolation features for isolating semiconductor devices. In particular, the present disclosure relates to a structure and method of forming shallow trench isolation structures using diblock copolymer patterning.

2. Description of Related Art

Modern integrated circuit manufacturing processes generally include millions of semiconductor devices, such as field effect transistors (FETs), having very small feature sizes. For example, gate electrodes and interconnects may include less than 0.08 µm in critical dimensions. As feature sizes continue to decrease, the size of the resulting device, as well as the interconnect between semiconductor devices must also decreases. Fabrication of smaller semiconductor devices allows more semiconductor devices to be positioned on a single monolithic semiconductor substrate, thereby allowing relatively large circuit systems to be incorporated on a single, relatively small die area.

Isolation structures, such as, for example, shallow trench isolations (STI), are provided between active regions of semiconductor devices for electrically isolating the semiconductor devices from one another. STI have become the most common and important isolation technology for sub-quarter micron complimentary metal oxide semiconductor (CMOS) devices. A conventional STI process flow includes forming a barrier oxide layer of $SiO_2$ over a semiconductor substrate. A nitride layer is then deposited over the barrier oxide layer. Next, a shallow trench area having apertures are formed in the nitride layer and the barrier layer for exposing a surface of the semiconductor substrate. An oxide deposition is then performed following the formation of the shallow trench area in the semiconductor substrate. The oxide deposition process forms a field oxide layer (trench oxide) that fills the shallow trench and the apertures. The oxide on the top surface of the nitride layer is then removed using a chemical-mechanical planerization (CMP) method. In some cases, the liner oxide layer is formed interposed between the trench oxide and the semiconductor substrate. Finally, the nitride layer is stripped from the barrier oxide layer with one or more suitable stripping agents.

Another conventional STI process flow includes pad oxide and chemical vapor deposition (CVD) silicon nitride (SiN) deposition, active area masking, nitride/oxide etching, silicon (Si) trench etching, liner oxidation, high density plasma (HDP) oxide filing, chemical mechanical polishing (CMP) polishing, and nitride and pad oxide removal.

However, as semiconductor device scales, HDP oxide becomes very difficult to fill into the ever narrower STI trench opening. Thus, during a STI trench fill process, HDP oxide deposition needs to be stopped periodically and intermediate etching steps are inserted to remove HDP oxide from the top surface of the trench so that HDP oxide may be filled into the lower part of the trench in the resumed HDP oxide deposition step. Often, multiple deposition-etch-deposition steps are required to complete the filling of the trench opening. Moreover, HDP process often damages the exposed substrate and reduces gate oxide thickness at the corner of STI trench opening causing problems with reliability, etc.

In addition, CMP uses abrasive and corrosive chemical slurry in conjunction with a polishing pad. The pad and substrate are pressed together by a dynamic polishing head and held in place by a plastic retaining ring. The dynamic polishing head is rotated at different polishing speed and pressure. This process, while it removes for making the substrate flat or planar, the CMP process may create uneven surface topology due to the non-uniform polishing speed and pressure.

Accordingly, a need exists for forming STI structures using alternative methods circumventing the limitations of HDP oxide deposition and CMP. The present disclosure provides a method of forming STI structures using diblock copolymer patterning.

SUMMARY OF THE INVENTION

The present disclosure is directed to a structure and method of forming shallow trench isolation structures using diblock copolymer patterning. In one embodiment, a method of isolating semiconductor devices formed on a semiconductor structure having a silicon on insulator (SOI) layer is described, the method including forming at least one shallow trench area on a pad nitride layer deposited on a surface of the SOI layer, wherein the at least one shallow trench area includes an opening for exposing a portion of the SOI layer; applying diblock copolymer material over the pad nitride layer and the at least one shallow trench area; annealing the applied diblock copolymer material to form self-organized patterns and partially etching the shallow trench area using the diblock copolymer material as an etch mask. The method of isolating semiconductor devices further includes oxidizing the semiconductor substrate, where the oxidizing of the semiconductor substrate includes forming an oxide region in the at least one shallow trench area. In addition, the oxidizing of the semiconductor substrate includes forming a plurality of voids on an oxidized region. A shallow trench isolation area is formed on at the at least one shallow trench area. In one embodiment, the diblock copolymer material is a polystyrene-block-polymethylmethacrylate (PS-b-PMMA) diblock copolymer. The polystyrene-block-polymethylmethacrylate (PS-b-PMMA) diblock copolymer self-assembles into a self-organized array of cylinders having a diameter, for example, from about 3 nm to about 50 nm. Other copolymer materials are also envisioned, such as example, polystyrene-block-polyethylene (PS-b-PE), polystyrene-block-polyorganosilicate (PS-b-POS), polystyrene-block-polyferrocenyldimethylsilate (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA).

In another embodiment, a method of forming shallow trench isolations using diblock copolymer patterning is described. The method includes forming at least one shallow trench area on a portion of a patterned semiconductor structure; depositing diblock copolymer material over the at least one shallow trench area; and etching the at least one shallow trench area having the diblock copolymer material as etch mask. The method further includes annealing the diblock copolymer material to segregate the diblock copolymer material into polymeric block components, where the polymeric block components are used as etch mask. In addition, the method further includes oxidizing the semiconductor structure to form an oxidation region. In addition, the oxidizing includes forming a plurality of void on the oxidized region.

In yet another embodiment, a semiconductor structure is provided. The structure includes an isolation structure formed on a silicon on insulator (SOI) layer of a semiconductor substrate the isolation structure having an oxidized substrate region; and a void region formed on the oxidized substrate region. The isolation structure may be a shallow trench isolation structure. In one embodiment, the oxidized substrate region is positioned between active regions of the semiconductor substrate. In addition, the void region is formed using diblock copolymer material as a mask. The diblock copolymer is formed by annealing the diblock copolymer material and selectively removing a portion of the diblock copolymer material. The diblock copolymer material may be a polystyrene-block-polymethylmethacrylate (PS-b-PMMA) diblock copolymer. However, other copolymer materials are also envisioned, such as polystyrene-block-polyethylene (PS-b-PE), polystyrene-block-polyorganosilicate (PS-b-POS), polystyrene-block-polyferrocenyldimethylsilate (PS-b-PFS), polyethyleneoxide-block-polyisoprene (PEO-b-PI), polyethyleneoxide-block-polybutadiene (PEO-b-PBD), and polyethyleneoxide-block-polymethylmethacrylate (PEO-b-PMMA).

Other features of the presently disclosed structure and method of forming shallow trench isolation structures using diblock copolymer patterning will become apparent from the following detailed description taken in conjunction with the accompanying drawing, which illustrate, by way of example, the presently disclosed structure and method.

BRIEF DESCRIPTION OF THE DRAWINGS

The features of the presently disclosed method of forming shallow trench isolation structures using diblock copolymer patterning will be described hereinbelow with references to the figures, wherein.

DETAILED DESCRIPTION

Figure 1:
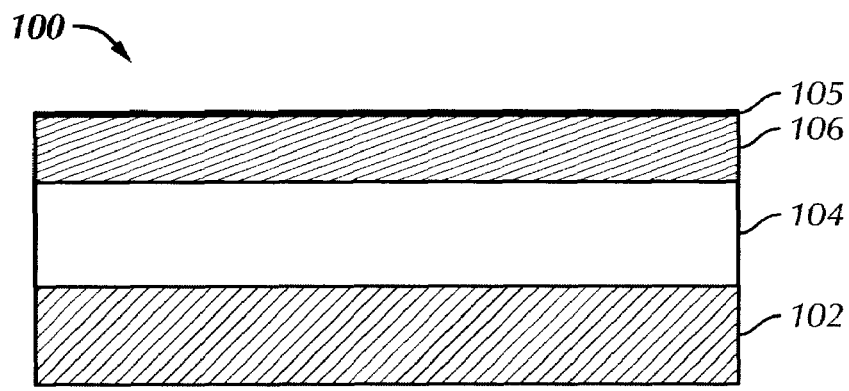
FIG. 1 illustrates a simplified cross-sectional view of a semiconductor substrate having a pad oxide layer deposited thereon, in accordance with the present disclosure.

Referring now to the drawing figures, wherein like references numerals identify identical or corresponding elements, an embodiment of the presently disclosed structure and method of forming shallow trench isolation (STI) structures will be disclosed in detail. In the following description, numerous specific details are set forth, such as particular structures, components, materials, dimensions, processing steps and techniques, in order to provide a thorough understanding of the present invention. However, it will be appreciated by one skilled in the art that the invention may be practiced without these specific details. In other instances, well-known structures or processing steps have not been described in detail to avoid obscuring the invention.

It will be understood that when a layer is referred to as being "on" or "over" another layer, it can be directly on the other element or intervening layers may also be present. In contrast, when a layer is referred to as being "directly on" or "directly over" another layer, there are no intervening layers present. It will also be understood that when a layer is referred to as being "connected" or "coupled" to another layer, it can be directly connected to or coupled to the other layer or intervening layers may be present. In contrast, when a layer is referred to as being "directly connected" or "directly coupled" to another layer, there are no intervening layers present.

FIGS. 1-12 illustrate an exemplary process of forming STI structures for isolating semiconductor devices by combining conventional lithography technology with block copolymer technology for transferring a diblock copolymer to a device structure and for forming sub-lithographic structural units. The sub-lithographic structural units are then individually formed and self-aligned to a lithographic feature over a device structure for sub-lithographic patterning of the device structure, in manner described in detail hereinbelow.

In particular, a pad oxide layer is first formed over the device structure to be patterned. One or more shallow trench areas are then formed in the pad oxide layer by conventional lithography and etching techniques. Such shallow trench areas each have an opening having a relatively large diameter, consistent with the resolutions of conventional lithographic technology. A thin layer of self-assembling diblock copolymer (having a thickness typically ranging from about 20 nm to about 100 nm is then deposited over the device structure and annealed to form an ordered pattern containing repeating structural units. The polymer block units are embedded in a polymeric matrix that is in turn located inside the shallow trench area openings. The polymeric block units have a diameter that is smaller than the diameter of the shallow trench areas openings. The polymer block units can be selectively removed relative to the polymeric matrix, thereby leaving openings of the smaller diameter in the polymeric matrix inside each shallow trench area opening. The polymer openings can then be used for sub-lithographic patterning of the device structure.

With initial reference to FIG. 1, an embodiment of a silicon-on-insulator (SOI) wafer, in accordance with the present disclosure, is illustrated and is designated generally as SOI wafer 100. SOI wafer 100 includes a base semiconductor substrate 102; a buried oxide (BOX) layer 104 positioned on base semiconductor substrate 102; and a SOI layer 106 positioned on BOX layer 104. A pad oxide layer 105 ranging in thickness from about 5 nm (nanometers) to about 20 nm is deposited over SOI layer 106, as illustrated by the figure.

Base semiconductor substrate 102 may include any of several semiconductor materials well known in the art, such as, for example, a bulk silicon semiconductor substrate, silicon-on-insulator (SOI) and silicon-on-sapphire (SOS). Other non-limiting examples include silicon, germanium, silicon-germanium alloy, silicon carbide, silicon-germanium carbide alloy and compound (i.e. III-V and II-VI) semiconductor materials. Non-limiting examples of compound semiconductor materials include gallium, arsenide, indium arsenide and indium phosphide semiconductor material. Typically, base semiconductor substrate 102 may be about, but is not limited to several hundred microns thick. For example, base semiconductor substrate 102 may include a thickness ranging from about 0.5 mm to about 1.5 mm.

BOX layer 104 may be formed from any of several dielectric materials. Non-limiting examples include, for example, oxides, nitrides and oxynitrides of silicon. Oxides, nitrides and oxynitrides of other elements are also envisioned. In addition, BOX layer 104 may include crystalline or non-crystalline dielectric material. Moreover, BOX layer 104 may be formed using any of several methods. Non-limiting examples include ion implantation methods, thermal or plasma oxidation or nitridation methods, chemical vapor deposition methods and physical vapor deposition methods. Typically, BOX layer 104 includes an oxide of the semiconductor from which base semiconductor substrate 102 is comprised. Typically, BOX layer 104 may includes a thickness ranging from about 100 nm to about 200 nm.

SOI layer 106 may include any of the several semiconductor materials included in base semiconductor substrate 102. In general, base semiconductor substrate 102 and SOI layer 106 may include either identical or different semiconductor materials with respect to chemical composition, dopant concentration and crystallographic orientation. In one particular embodiment of the present disclosure, base semiconductor substrate 102 and SOI layer 106 include semiconductor materials that include at least different crystallographic orientations. Typically one of base semiconductor substrate 102 and SOI layer 106 includes a 110 crystallographic orientation and the other of base semiconductor substrate 102 and SOI layer 106 includes a 100 crystallographic orientation. Typically, SOI layer 106 includes a thickness ranging from about 5 nm to about 100 nm.

Figure 2:
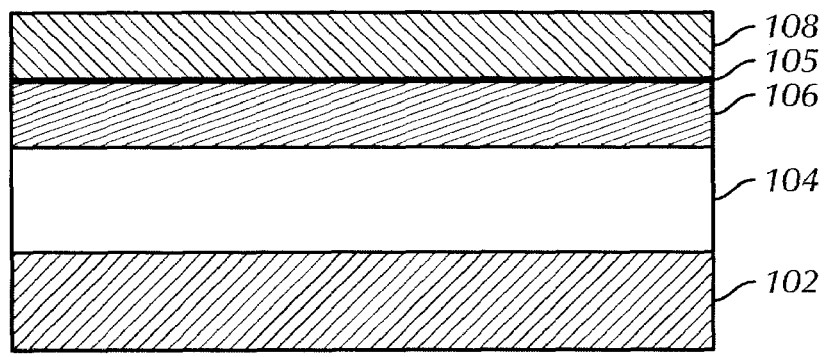
FIG. 2 illustrates the semiconductor substrate of FIG. 1 following a pad nitride deposition.

With reference to FIG. 2, a pad nitride layer 108 is laid over pad oxide layer 105 using conventional lithographic patterning methods. In one embodiment, pad nitride layer 108 includes a thickness of about 50 nm to 150 nm.

Figure 3:
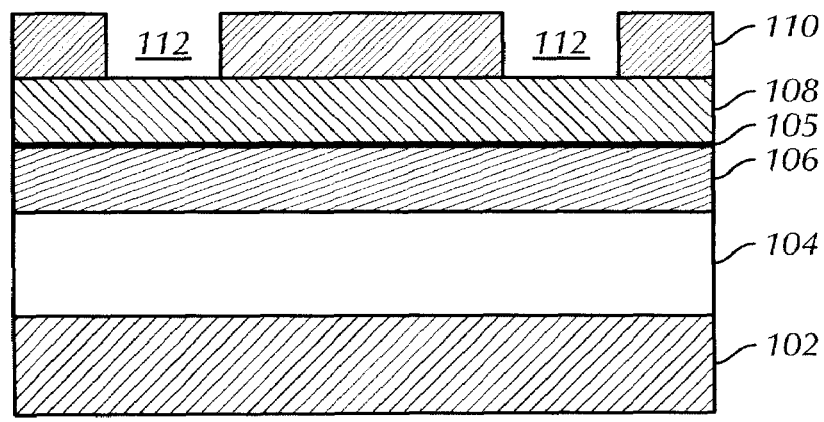
FIG. 3 illustrates the semiconductor substrate of FIG. 2 following a photoresist patterning.

With reference to FIG. 3, a photoresist pattern 110 defining isolation region or openings 112 is then formed on top of pad nitride layer 108. Openings 112 are configured for exposing a portion of pad nitride layer 108 for defining an isolation region, i.e. a portion whereon STI structures are to be formed. Photoresist pattern 110 may include a thickness of about 100 nm to 300 nm.

Figure 4:
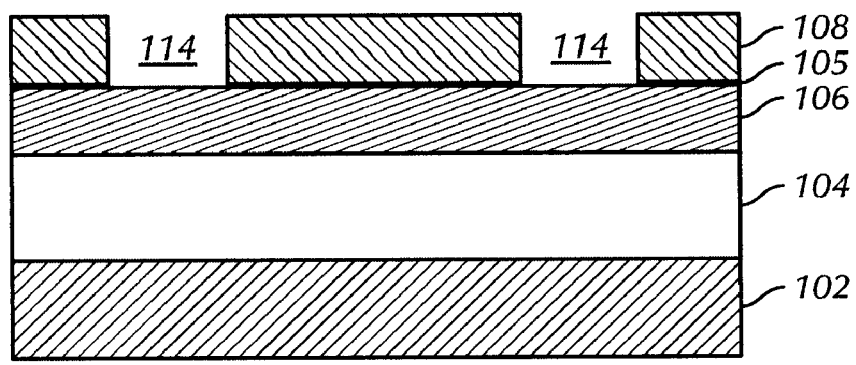
FIG. 4 illustrates the semiconductor substrate of FIG. 3 following an anisotropical etching process.

With reference to FIG. 4, photoresist pattern 110 is exposed, developed and stripped using methods well known in the semiconductor fabrication art. Examples of stripping methods include wet chemical, dry plasma and aggregate stripping methods thereof. With continued referenced to the figure, pad oxide layer 105 and pad nitride layer 108 are selectively etched using conventional anisotropic etching processes (e.g. reactive ion etch process), thus forming a shallow trench area 114. It is noted that shallow trench area 114 includes an opening for exposing a portion of SOI layer 106.

Figure 5:
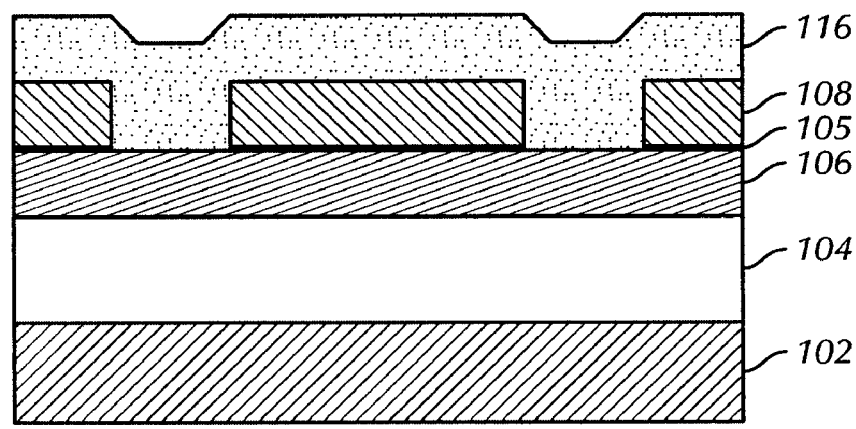
FIG. 5 illustrates the semiconductor substrate of FIG. 4 following a blanket deposition of diblock copolymer material.
Figure 6:
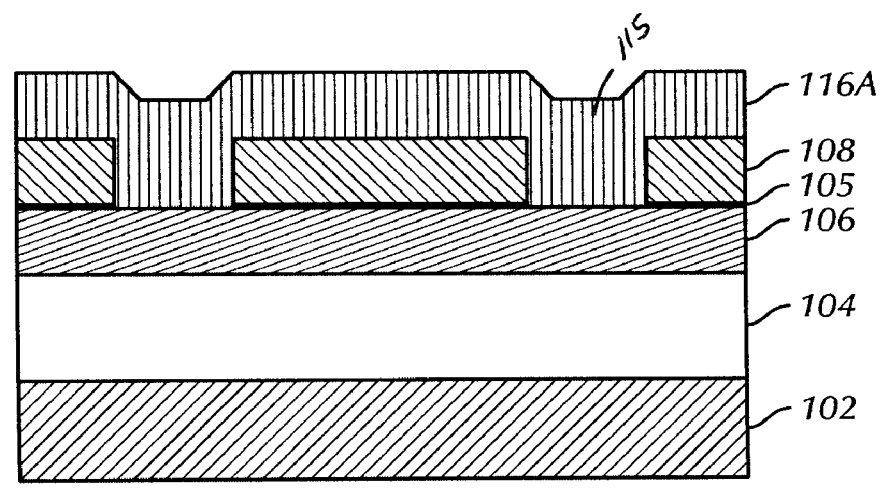
FIG. 6 shows the semiconductor substrate of FIG. 5 illustrating self-assembling of the diblock copolymer material, in accordance with the present disclosure.

With reference to FIGS. 5 and 6, a blanket deposition of diblock copolymer material 116 is formed conformally over the pattered structure, filling shallow trench area 114. In one particular embodiment, diblock copolymer material 116 includes, for example, a film of polystyrene-block-polymethylmethacrylate (PS-b-PMMA) diblock copolymer as a starting material that self-assembles into polymeric block components. In particular, polystyrene-block-polymethylmethacrylate (PS-b-PMMA) diblock copolymer self-assembles into a self-organized array of cylinders embedded in a polystyrene (PS) matrix. The cylinders are oriented normal to the plane of the film by, among other known means, spreading a drop of dilute polymer solution in toluene, or like solvent, onto the surface of a de-ionized water bath and allowing the toluene to evaporate. This process leaves behind a film typically 100 to 200 nm thick. The polystyrene-block-polymethylmethacrylate (PS-b-PMMA) cylinders are then removed by annealing and reaction with ozone, thereby leaving behind a nanoscale block component 116A (FIG. 6) with hexagonally stacked holes 115 typically about 13 nm in diameter, though by controlling the molecular weight of the copolymers one can control the hole size to range from about 2 to about 100 nanometers. In one embodiment the hexagonally stacked holes 115 may range from about 10 to about 50 nanometers. Alternatively, the hexagonally stacked holes 115 may range from about 10 to about 25 nanometers apart.

Diblock copolymer material 116 may be applied using any suitable techniques, including, but not limited to, spin casting, coating, spraying, ink coating, dip coating, etc. In one particular embodiment, diblock copolymer material 116 is spin cast onto the entire pattered structure for forming a nanoscale thin film.

The annealing process described hereinabove may include a ultra-violet (UV) treatment and low temperature anneal (i.e. annealing temperature of about 120° C. to about 300° C.). The thermal annealing may last from less than about 1 hour to about 10 hours, and more particularly from about 0.1 hour to about 2 hours exposure and low temperature anneal.

Other diblock copolymer materials are set forth in greater detail in commonly assigned U.S. Pat. No. 6,506,660, the disclosure of which is incorporated by reference herein in its entirety.

Figure 7:
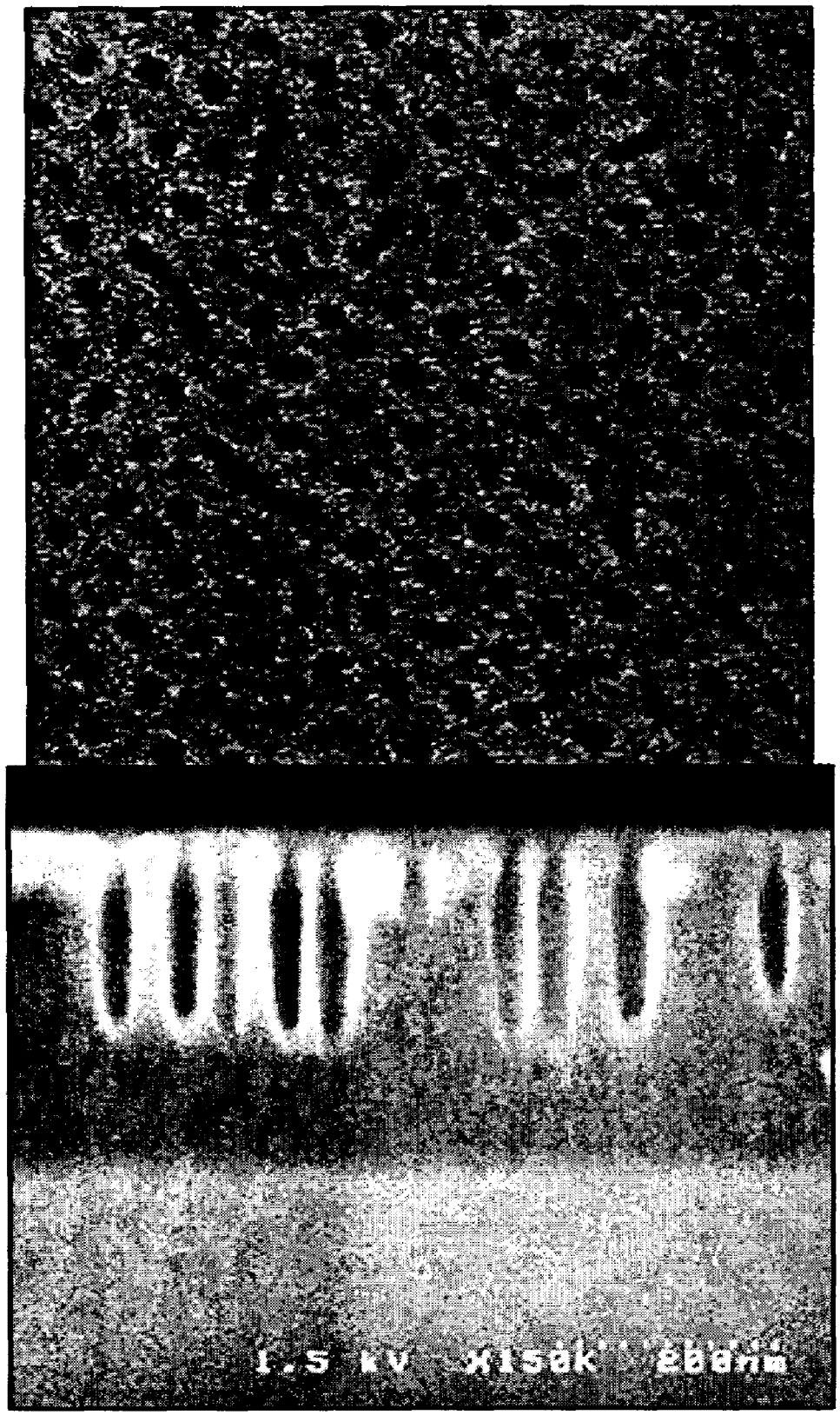
FIG. 7 illustrates a top-down scanning electron microscopic (SEM) photograph of a diblock copolymer patterned following the processing steps described in FIGS. 1-6.

FIG. 7 (top) illustrates a top-down scanning electron microscopic (SEM) photograph of the diblock copolymer material 116 after the above described treatment. As illustrated by the figure, the hexagonal stacked holes having a diameter of about 20 nm are distributed in a regular manner in the PS matrix. FIG. 7 (bottom) illustrates a cross-sectional SEM photograph illustrating the diblock copolymer pattern being transferred into a substrate using reactive ion etch (RIE) process.

Figure 8:
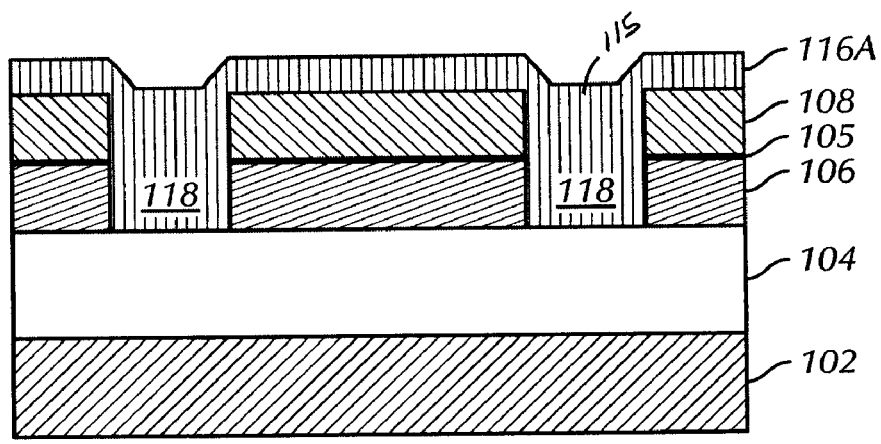
FIG. 8 shows the semiconductor substrate of FIG. 6, illustrating the transfer of the diblock copolymer material columnar structures to a portion of the semiconductor substrate.

With reference to FIG. 8, an isotropic dry or wet etching process is used for forming openings 118 on a portion of SOI layer 106 using diblock copolymer 116 as a mask. As illustrated by the figure, the pattern of diblock copolymer (i.e. copolymer component) 116A is transferred to openings 118 of SOI layer 106 using selective RIE process. Copolymer component 116A is used as a masking layer during the RIE process.

Figure 9:
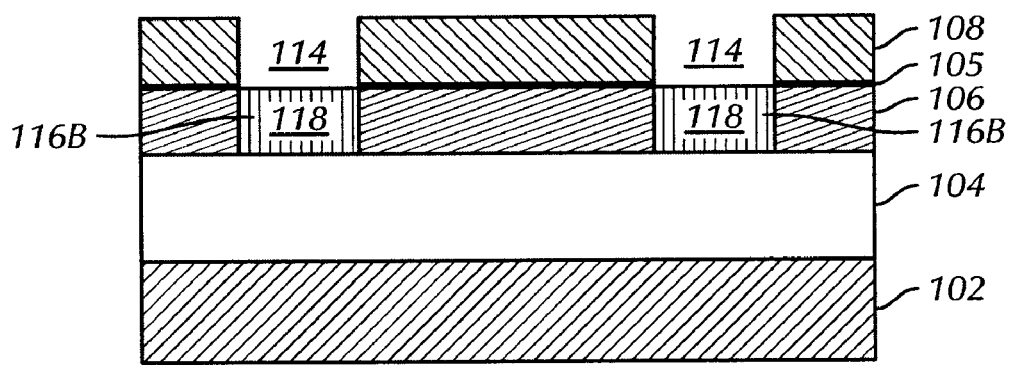
FIG. 9 illustrates the semiconductor substrate of FIG. 8 following the removal of the diblock copolymer material.
Figure 10:
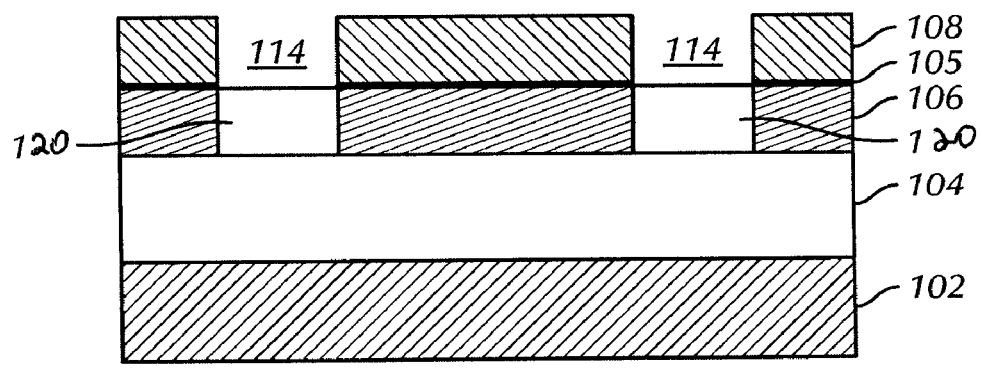
FIG. 10 illustrates the semiconductor substrate of FIG. 9 following oxidation anneal.

With reference to FIGS. 9 and 10, copolymer component 116A is removed, leaving behind a plurality of voids 116B within openings 118 of SOI layer 106 (FIG. 9). Next, an oxidation anneal process (annealing temperature of about 700° C. to about 1100° C.) is performed for turning opened SOI layer 106 into $SiO_2$ 117, as illustrated in FIG. 10. The oxidation process may be carried in oxidizing ambient including, for example, $O_2$, NO, $N_2O$, or $H_2O$ in a rapid thermal oxidation (RTO) chamber or in a furnace. Plasma enhancement may also be used in the oxidation process.

Figure 11:
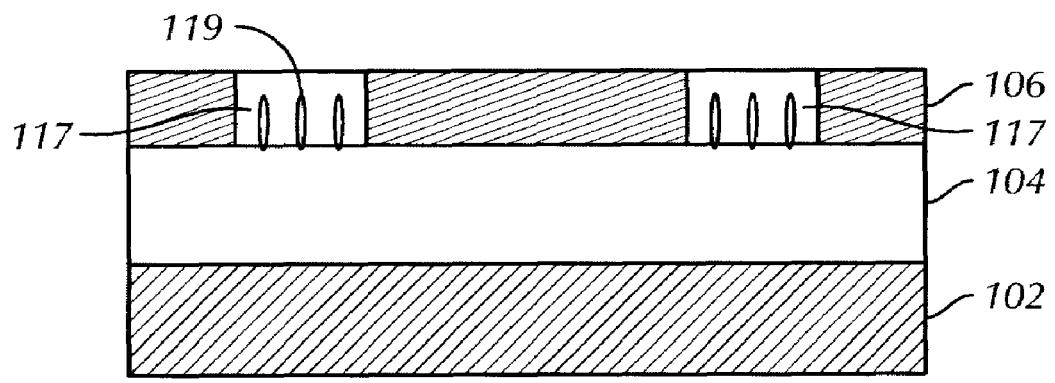
FIG. 11 illustrates the semiconductor substrate of FIG. 10 following removal of the pod nitride layer.

With reference to FIG. 11, a hard mask removal process is then followed for removing pad nitride layer 108. Oxide region 117 is formed including, for example, a plurality of voids 119, a substrate material and continuous oxide isolation. The composition of oxide region 117 may be controlled by adjusting ratio of remaining substrate and dimension of columnar structures, as well as oxidation process parameters.

Figure 12:
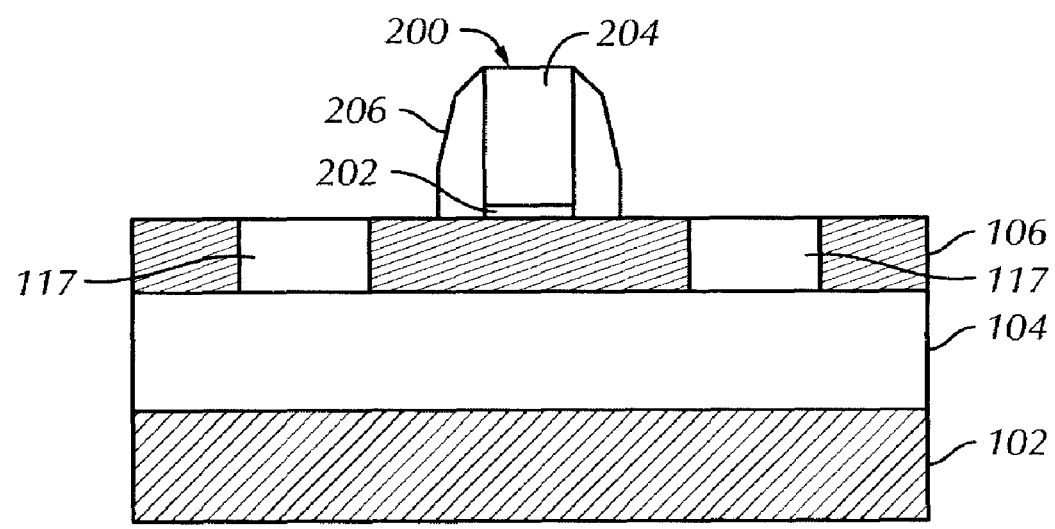
FIG. 12 illustrates the semiconductor substrate of FIG. 11 following the formation of a field effect transistor on a device region of the semiconductor substrate.

With reference to FIG. 12, at least one field effect transistors (FET) 200, such as, for example, pFETs and/or nFETs are then formed on a device (i.e. oxide) region of SOI layer 106. FET devices 200 may also include a plurality of pFETs, nFETs, or a combination thereof. In particular, each FET 200 includes a gate dielectric 202, a gate conductor 204 and spacers 206. The devices may be fabricated using conventional complementary metal oxide semiconductor (CMOS) processing steps that are well know to those skilled in the art. The CMOS processing steps include, for example, deposition or thermal growing of a gate dielectric 202, deposition of a gate conductor 204 and patterning gate conductor 204. FIG. 12 illustrates the resulting structure including device 200 formed on the device region.

Figure 13:
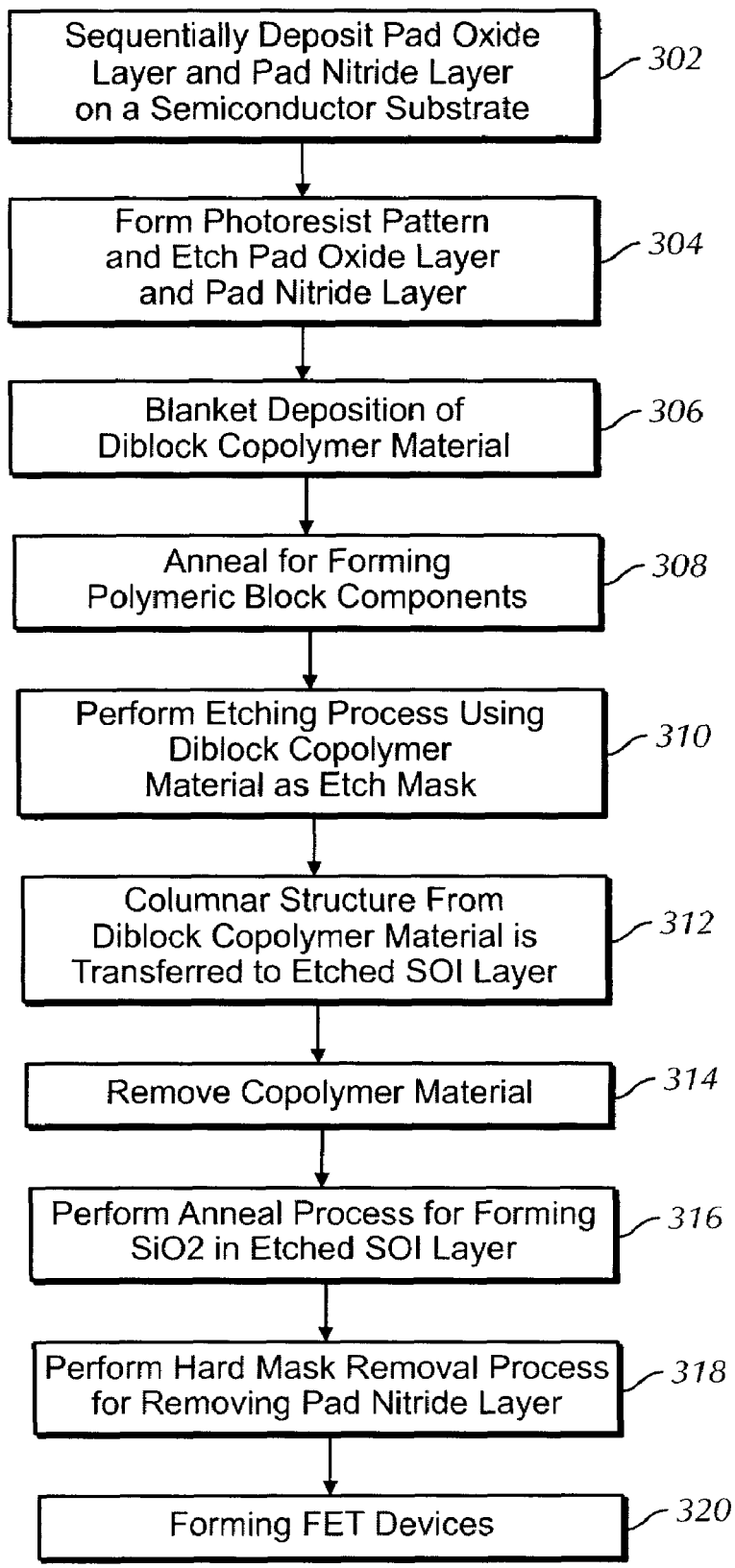
FIG. 13 is an exemplary flow diagram illustrating the method for forming shallow trench isolation structures in a semiconductor device using diblock copolymer patterning, in accordance with the present disclosure.

With reference to FIG. 13, in conjunction with FIGS. 1-12, a flow diagram of an exemplary method of forming a STI in a semiconductor device using diblock copolymer patterning, in accordance with the present disclosure, is illustrated. A device structure, such as, for example an SOI wafer 100 is provided having semiconductor substrate 102, BOX layer 104 and SOI layer 106, as discussed hereinabove. In accordance with the present disclosure, initially, at step 302, a pad oxide layer 105 and a pad nitride layer 108 is sequentially deposited over SOI layer 106. At step 304, a photoresist pattern is formed on pad nitride layer 108 for defining an isolation region or openings 112. Pad oxide layer 105 and pad nitride layer 108 are etched for forming a shallow trench area 114. Photoresist pattern 110 is stripped. At step 306, a layer of diblock copolymer material 116 is conformally deposited over the patterned pad nitride layer 108. At step 308, diblock copolymer material 116 is annealed for segregating diblock copolymer material 116 into polymeric block components. At step 310, the device structure is etched using diblock copolymer material 116 as etch mask. At step 312, columnar structure from the diblock copolymer material 116 is transferred to the etched SOI structure 106. At step 314, diblock copolymer material 116 is removed. At step 316, an anneal process is performed for forming $SiO_2$ in the etched SOI structure 106. At step 318, a hard mask removal process is followed for removing pad oxide layer 105 and pad nitride layer 108. Finally, at step 320, a plurality of FET devices are formed on an oxide region of SOI structure 106.

Using the method described in the present disclosure, STI fill and followed CMP processes are avoided. Defects such as STI corner rounding, plasma damage and CMP non-uniformity are reduced from device structure. By including plurality of voids in the oxidized region, better isolation and lower parasitic capacitance may be achieved.

It will be understood that numerous modifications and changes in form and detail may be made to the embodiments of the presently disclosed structure and method of forming shallow trench isolation (STI) structures using copolymer patterning. It is contemplated that numerous other configuration of the SOI wafer 100 may be used, and the material of the structure and method may be selected from numerous materials other than those specifically disclosed. Therefore, the above description should not be construed as limiting the disclosed structure and method, but merely as exemplification of the various embodiments thereof. Those skilled in the art will envisioned numerous modifications within the scope of the present disclosure as defined by the claims appended hereto. In short, it is the intent of the Applicants that the scope of the patent issuing herefrom will be limited only by the scope of the appended claims. Having thus complied with the details and particularity required by the patent laws, what is claimed and desired protected is set forth in the appended claims.

What is claimed is:

1. A method of isolating semiconductor devices formed on a semiconductor substrate having a silicon on insulator (SOI) layer, the method comprising:
   forming at least one shallow trench area on a pad nitride layer deposited on a surface of said SOI layer, wherein said at least one shallow trench area includes an opening for exposing a portion of said SOI layer;
   applying diblock copolymer material over said pad nitride layer and said at least one shallow trench area;
   annealing said applied diblock copolymer material to form self-organized patterns; and
   etching said shallow trench area using said diblock copolymer material as an etch mask.

2. The method of isolating semiconductor devices as recited in claim 1, further comprising oxidizing said semiconductor substrate.

3. The method of isolating semiconductor devices as recited in claim 2, wherein said oxidizing includes forming an oxide region in said at least one shallow trench area.

4. The method of isolating semiconductor devices as recited in claim 2, wherein said oxidizing includes forming a plurality of voids on an oxidized region.

5. The method of isolating semiconductor devices as recited in claim 1, wherein said diblock copolymer material is a polystyrene-block-polymethylmethacrylate (PS-b-PMMA) diblock copolymer.

6. The method of isolating semiconductor devices as recited in claim 5, wherein said polystyrene-block-polymethylmethacrylate (PS-b-PMMA)diblock copolymer self-assembles into a self-organized array of cylinders having a diameter from about 3 nm to about 50 nm.

7. The method of isolating semiconductor devices as recited in claim 1, further comprising forming a shallow trench isolation structure on said at least one shallow trench area.

8. A method of forming shallow trench isolations using diblock copolymer patterning, the method comprising:
   forming at least one shallow trench area on a portion of a patterned semiconductor structure;
   depositing diblock copolymer material over said at least one shallow trench area; and
   etching said at least one shallow trench area having said diblock copolymer material as etch mask.

9. The method of forming shallow trench isolations as recited in claim 8, further comprising annealing said diblock copolymer material to segregate said diblock copolymer material into polymeric block components.

10. The method of forming shallow trench isolations as recited in claim 9, wherein said polymeric block components are used as etch mask.

11. The method of forming shallow trench isolations as recited in claim 9, further comprising transferring said polymeric block components onto a portion of said semiconductor structure.

12. The method of forming shallow trench isolations as recited in claim 8, further comprising oxidizing said semiconductor structure to form an oxidation region.

13. The method of forming shallow trench isolations as recited in claim 11, wherein said diblock copolymer material is selected from a group consisting of polystyrene-block-polyethylene (PS-b-PE), polystyrene-block-polyorganosilicate (PS-b-POS), polystyrene-block-polyferrocenyldimethylsilate (PS-b-PFS), polyethyleneoxide-block-polyisoprene (PEO-b-PI), polyethyleneoxide-block-polybutadiene (PEO-b-PBD) and polyethyleneoxide-block-polymethylmethacrylate (PEO-b-PMMA).

14. The method of forming shallow trench isolations as recited in claim 11, wherein said oxidizing includes forming a plurality of void on said oxidized region.

15. A semiconductor structure comprising:
   an isolation structure formed on a silicon on insulator (SOI) layer of a semiconductor substrate said isolation structure having an oxidized substrate region; and
   a void region formed on said oxidized substrate region; wherein said void region contains more than one void and the voids are separated by said oxidized substrate region.

16. The semiconductor structure as recited in claim 15, wherein said isolation structure is a shallow trench isolation structure.

17. The semiconductor structure as recited in claim 15, wherein said oxidized substrate region is positioned between active regions of said semiconductor substrate.

18. The semiconductor structure as recited in claim 15, wherein said void region is formed using diblock copolymer material as a mask.

19. The semiconductor structure as recited in claim 18, wherein said diblock copolymer pattern is formed by annealing said diblock copolymer material and selectively removing a portion of said diblock copolymer material.

20. The semiconductor structure as recited in claim 18, wherein said diblock copolymer material is a polystyrene-block-polymethylmethacrylate (PS-b-PMMA) diblock copolymer.

* * * * *